United States Patent [19]

Edwards

[11] 4,158,147

[45] Jun. 12, 1979

[54] UNIDIRECTIONAL SIGNAL PATHS

[75] Inventor: Colin R. Edwards, Mangotsfield, England

[73] Assignee: National Research Development Corporation, London, England

[21] Appl. No.: 818,222

[22] Filed: Jul. 22, 1977

[30] Foreign Application Priority Data

Aug. 3, 1976 [GB] United Kingdom ............... 32196/76

[51] Int. Cl.² .................... H03K 19/32; H03K 19/08; G11C 17/00
[52] U.S. Cl. .................................... 307/216; 307/203; 307/213; 307/217; 365/96
[58] Field of Search ............... 307/203, 207, 213, 215, 307/216, 217, 218; 364/716; 365/96, 104

[56] References Cited

U.S. PATENT DOCUMENTS

| | | | |
|---|---|---|---|
| 3,175,197 | 3/1965 | Miller et al. .................. | 364/716 X |
| 3,335,403 | 8/1967 | Mann et al. .................. | 307/218 X |
| 3,529,299 | 9/1970 | Chung et al. .................. | 365/96 |
| 3,533,088 | 10/1970 | Rapp .................. | 307/304 X |
| 3,602,732 | 8/1971 | Suzuki .................. | 307/216 X |
| 3,611,319 | 10/1971 | Hyatt .................. | 365/96 X |
| 3,769,525 | 10/1973 | Foss et al. .................. | 307/215 X |
| 3,818,252 | 6/1974 | Chiba et al. .................. | 307/303 |
| 3,976,983 | 8/1976 | Moussie .................. | 365/96 |
| 4,037,270 | 7/1977 | Ahmann et al. ............. | 174/52 FP X |
| 4,053,794 | 10/1977 | Edwards .................. | 307/207 X |

Primary Examiner—Larry N. Anagnos
Attorney, Agent, or Firm—Cushman, Darby & Cushman

[57] ABSTRACT

A circuit element for forming a unidirectional signal path between two signal connections is programmable both to choose the direction of signal travel on the signal path and whether the signal path passes a direct signal or a logical inverse signal. The programming is carried out by applying programming signals to the two signal connection points to cause selective fusing of one or more fusible links.

5 Claims, 3 Drawing Figures

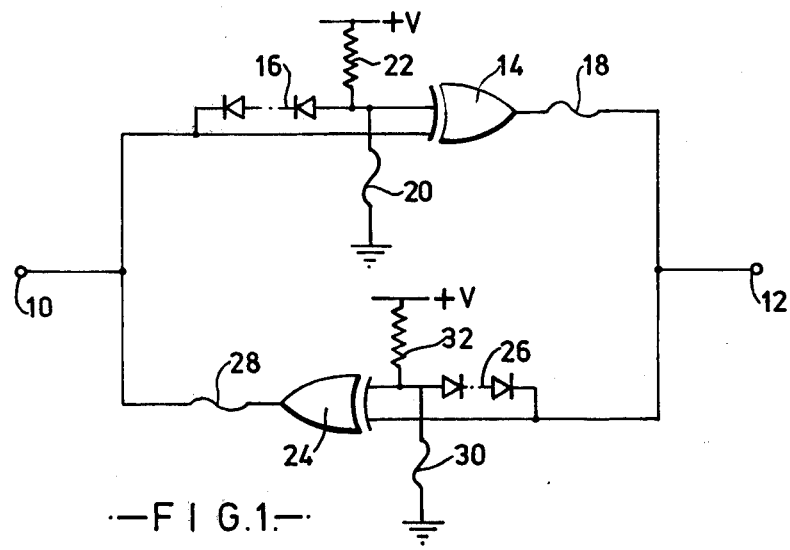
—FIG.1.—
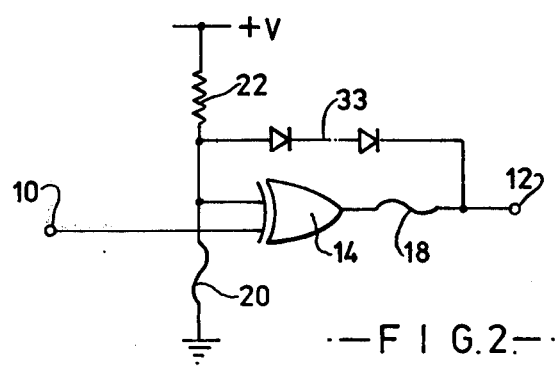
—FIG.2.—
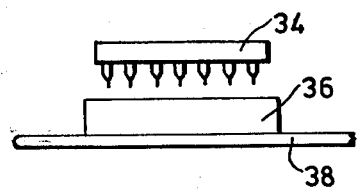
—FIG.3.—

UNIDIRECTIONAL SIGNAL PATHS

This invention relates to circuit elements providing unidirectional signal paths.

According to the invention, there is provided a circuit element comprising first and second unidirectional signal paths between two signal connection points and programming means operative to selectively determine which of said signal paths is enabled.

In a preferred form of the invention the unidirectional signal path may be either a direct signal path or a logical inverse signal path.

The mode of operation of the circuit element may be determined by applying programming signals to the two signal connection points. However, other existing external connections such as power supply lines may be employed or extra connections may be provided specifically for programming.

An embodiment of the invention will be described by way of example with reference to the accompanying drawing in which:

FIGS. 1 and 2 are schematic circuit diagrams, and

FIG. 3 is a side view of a socket for an integrated circuit package.

The drawing illustrates a circuit element for providing unidirectional connection between two signal connection points 10 and 12. The signal connection point 10 is directly connected to a first input of an EXCLUSIVE-OR gate 14 and connected to the second input thereof by a diode stack 16. The output of the gate 14 is connected to the second signal connection point 12 by a fusible link 18. In addition, the second input of the gate 14 is connected to earth by a further fusible link 20 and to a positive reference potential +V (logical 1) by a resistor 22. The gate 14 and associated components provide a signal path for signals travelling from the signal connection point 10 to the signal connection point 12.

A path for signals travelling from the signal connection point 12 to the signal connection point 10 is provided by a second EXCLUSIVE-OR gate 24 with an associated diode stack 26, fusible links 28 and 30, and a resistor 32 which are interconnected in an equivalent manner to the components associated with the EXCLUSIVE-OR gate 14.

In use, the mode of operation of the device is determined by selectively fusing one or more of the links 18, 20, 28 and 30 as indicated in the following table where S indicates a short circuit, O indicates an open circuit, X indicates "don't care", and A and B are the signals at the connection points 10 and 12 respectively.

| Fuse | | | | |
| --- | --- | --- | --- | --- |
| 18 | 20 | 28 | 30 | Mode |
| S | S | O | X | A $\longrightarrow$ B |
| S | O | O | X | $\overline{A}\longrightarrow$ B |
| O | X | S | S | B $\longrightarrow$ A |
| O | X | S | O | $\overline{B}\longrightarrow$ A |

For example when the mode A→B is required, fusing of the link 28 disconnects the output of the gate 24 from the signal connection point 10. Since the link 20 is intact, the second input of the gate 14 is held to earth (logical 0). Consequently a logical signal applied at the signal connection point 10 appears as the output of the gate 14 and is applied therefrom to the signal connection point.

If the mode $\overline{A}\to B$ is required, the link 28 is fused as before so as to disconnect the output of the gate 24. The link 20 is also fused so that the second input of the gate 14 is held at potential +V (Logical 1) by the resistor 22. Consequently the output of the gate 14 is the inverse of whatever logical signal is applied to the signal connection point 10 and this output is applied to the signal connection point 12.

The operation for signals travelling in the other direction from the signal connection point 12 to the signal connection point 10 is analogous, the link 18 being fused to isolate the output of the gate 14 while the link 28 is left intact.

When it is desired to fuse the line 18, a signal is applied to the signal connection point 10 such that the output of the gate 14 is logical 0. At the same time the signal connection point 12 is driven to a positive voltage such that the resulting current in the link 18 is sufficient to fuse the link 18. When it is desired to fuse the link 20, the signal connection point 10 is connected to a negative voltage so that a current path exists through the diode stack 16 and the link 20, the resulting current causing fusing of the link 20 to the open circuit condition. Fusing the links 28 and 30 can be carried out in an equivalent manner.

It should be noted that the diode stacks 16 and 26 have a forward bias voltage which exceeds the threshold voltages of the gates 14 and 24 respectively. The links 18 and 28 must be rated so as not to fuse when a potential difference of V is applied, and, in some circumstances it may be necessary to provide means for limiting the maximum current flowing therethrough in normal use, in order to avoid inadvertent fusing.

The diode stack 16 may be replaced by a diode stack 33 connected between the second input of the EXCLUSIVE-OR gate 14 and the signal connection point 12, as shown in FIG. 2. The circuit operates as before except that, when it is desired to fuse the link 20, the signal point 12 is connected to the negative voltage instead of the signal point 10. Unless the diode stack 26 is similarly replaced by a diode stack connected to the signal point 10, such negative voltage will also fuse the link 30 but this is of no importance because one or other of the links 18 and 28 will, in any event, be used, leaving only one of the EXCLUSIVE-OR gates 14 and 24 in use.

A common use for circuits in accordance with the invention is to connect them between integrated circuit packages and other digital circuits so that, by suitable programming, any signal output or input of the digital circuit could be inverted or non-inverted depending on the programming applied. For example, FIG. 3 shows an integrated circuit 34 suitable for connection to a socket 36 mounted on a printed circuit board 38. Each connector of the socket, except for the power supply connectors, incorporates a circuit element as illustrated in FIG. 1. Since such a circuit element can be programmed to operate in either direction, it is not necessary to pre-designate some of the connectors of the socket as input connections and others as output connections. Power for the circuit elements is taken from the power supply connectors of the socket. This arrangement not only eliminates the need to provide inverter packages on the printed circuit board, thereby simplifying the layout thereof, but also enables a better utilisation to be made of existing integrated circuits. For example, an OR gate can be converted to an AND gate by providing inverters at its output and/or of its input. Thus, only one type of integrated circuit package is needed to provide all vertex functions and, in general, fewer packages will be only partially utilised.

Circuits in accordance with the invention may also be included other mounting arrangements for integrated circuit packages.

I claim:

1. A circuit element comprising first and second unidirectional signal paths connected between two signal connection points so as to pass signals in respective opposite directions therebetween, a respective fusible link in series with each signal path and programming means operative to selectively fuse one or the other of the fusible links thereby to select the direction which signals are to be passed by the circuit element.

2. A circuit element according to claim 1, wherein each signal path includes programmable means for determining whether such signal path is a direct signal path or a logical inverted signal path.

3. A circuit element according to claim 2, wherein each signal path comprises an EXCLUSIVE-OR gate having one input connected directly in the signal path and the other input connected in the signal path via a diode, the said programmable means comprising a resistor connecting the said other input to means for supplying a first reference potential and a fusible link connecting the said other input to means for supplying a second reference potential.

4. A circuit element according to claim 2, wherein each signal path comprises an EXCLUSIVE-OR gate having one input connected directly in the signal path and the other input connected to the output of the signal path via a diode, the said programmable means comprising a resistor connecting the said other input to means for supplying a first reference potential and a fusible link connecting the said other input to means for supplying a second reference potential.

5. A mounting arrangement for an integrated circuit package comprising a socket having a connector for each electrical connection of the integrated circuits, at least one of said connectors including a circuit element comprising first and second unidirectional signal paths connected between two signal connection points so as to pass signals in respective opposite directions therebetween, a respective fusible link in series with each signal path and programming means operative to selectively fuse one or the other of the fusible links thereby to select the direction which signals are to be passed by the circuit element.

* * * * *